(12) United States Patent
Oikawa et al.

(10) Patent No.: US 8,390,192 B2
(45) Date of Patent: Mar. 5, 2013

(54) INK COMPOSITION FOR ORGANIC EL THIN FILM, AND ORGANIC EL ELEMENT

(75) Inventors: Kazuma Oikawa, Osaka (JP); Yoshie Iwane, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/377,297

(22) PCT Filed: Jun. 10, 2010

(86) PCT No.: PCT/JP2010/003863
§ 371 (c)(1),
(2), (4) Date: Dec. 9, 2011

(87) PCT Pub. No.: WO2010/143431
PCT Pub. Date: Dec. 16, 2010

(65) Prior Publication Data
US 2012/0104944 A1 May 3, 2012

(30) Foreign Application Priority Data

Jun. 12, 2009 (JP) ................................ 2009-140846

(51) Int. Cl.
*H05B 33/20* (2006.01)
(52) U.S. Cl. ........................................ 313/504; 313/503
(58) Field of Classification Search .......... 313/498–512; 315/169.3; 345/36, 45, 76
See application file for complete search history.

(56) References Cited

U.S. PATENT DOCUMENTS

| 5,748,271 | A | 5/1998 | Hikmet et al. |
| 6,623,870 | B1 | 9/2003 | Epstein et al. |
| 2005/0025994 | A1 | 2/2005 | Hanna et al. |
| 2007/0173578 | A1 | 7/2007 | Spreitzer et al. |
| 2007/0215879 | A1* | 9/2007 | Liu et al. .................. 257/79 |
| 2008/0111109 | A1 | 5/2008 | Inoue et al. |

FOREIGN PATENT DOCUMENTS

| JP | 10-508979 | 9/1998 |
| JP | 11-111459 | 4/1999 |
| JP | 2000-515578 | 11/2000 |
| JP | 2003-163087 | 6/2003 |
| JP | 2003-201274 | 7/2003 |
| JP | 2005-050553 | 2/2005 |
| JP | 2007-527624 | 9/2007 |
| JP | 2008-124157 | 5/2008 |
| WO | 97/07654 | 2/1997 |

OTHER PUBLICATIONS

International Search Report issued Sep. 14, 2010 in International (PCT) Application No. PCT/P2010/003863, of which the present application is the national stage.
J.H. Burroughes et al., "Light-emitting diodes based on conjugated polymers", Nature, vol. 347, Oct. 11, 1990, pp. 539-541.
International Preliminary Report on Patentability with Written Opinion issued Jan. 17, 2012 in International (PCT) Application No. PCT/JP2010/003863.
D. Braun et al., "Visible light emission from semiconducting polymer diodes", Applied Physics Letters, vol. 58, No. 18, pp. 1982-1984, (1991).

* cited by examiner

*Primary Examiner* — Nimeshkumar Patel
*Assistant Examiner* — Christopher Raabe
(74) *Attorney, Agent, or Firm* — Wenderoth, Lind & Ponack, L.L.P.

(57) ABSTRACT

Disclosed is an ink composition for an organic EL thin film, that is, an ink composition for the formation of an organic EL thin film including an organic EL material, a liquid crystalline compound with a bandgap of 3.5 eV or more, and a solvent having an organic compound. Furthermore, the liquid crystalline compound preferably contains no functional group of —CN, —OH, or —F. Moreover, the liquid crystalline compound preferably has a molecular dipole moment of 4.0 debyes or less.

7 Claims, 2 Drawing Sheets

INK COMPOSITION FOR ORGANIC EL THIN FILM, AND ORGANIC EL ELEMENT

BACKGROUND

1. Technical Field

The present application claims the priority of Japanese Patent Application No. 2009-140846 filed in Japan on Jun. 12, 2009, the contents of which are hereby incorporated by reference.

The present invention relates to an ink composition for an organic EL thin film (a solution containing an organic EL material), a method for forming an organic EL thin film, an organic EL thin film, and an organic EL element. The present invention relates to, for example, a solution containing an organic EL material, for use in the formation of an organic thin film constituting an organic EL element by a coating method.

2. Background Art

Organic electroluminescence (EL) elements refer to elements using the principle that holes and electrons injected respectively from a positive electrode and a negative electrode by the application of an electric field are recombined to cause an organic material to produce luminescence. Since C. W. Tang, et al., at Eastman Kodak Company reported a low-voltage driving organic EL element of a laminate-type element, research has been carried out actively on organic EL elements including an organic material as a constituent material.

Tang, et al. have proposed a stacked structure using tris(8-quinolinol)aluminum for a light-emitting layer and a triphenyldiamine derivative for a hole transporting layer. The advantages of the stacked structure include the ability to increase the injection efficiency of holes into the light-emitting layer, the ability to increase the generation efficiency of excitons generated by recombination through the blocking of electrons injected into a negative electrode, and the ability to trap excitons generated in the light-emitting layer. Two-layer type structures of a hole transporting (injecting) layer and an electron transporting light-emitting layer, three-layer type structures of a hole transporting (injecting) layer, a light-emitting layer, and an electron transporting (injecting) layer, or the like are well-known as the element structure of an organic EL element as in this example. In order to increase the recombination efficiency of injected holes and electrons, various devises have been made for the element structure and formation method in the case of these elements of stacked structure type.

While high-molecular materials and low-molecular materials are known as organic EL materials, the development of low-molecular organic EL materials has been advanced in view of simplicity in synthesis and of possible high-purity purification through sublimation purification. Furthermore, among the low-molecular organic EL materials, excellent organic EL materials in terms of efficiency, lifetime, and color purity have been reported, and put into practical use.

For the deposition of the low-molecular organic EL material into a thin film, a vacuum deposition method is adopted, so that the low-molecular organic EL material is sublimated with favorable thermal stability and deposited onto a substrate to achieve a high-performance organic EL element. However, the vacuum deposition method has the problem of requirements for high-vacuum equipment and a complicated production process, thus, deposition through a wet method such as spin coating or ink jet has been desired instead of the vacuum deposition method.

On the other hand, organic electroluminescence elements using, as a luminescent material, a polymer such as poly(p-phenylenevinylene) (PPV) or poly(2-methoxy-5-(2'-ethylhexyloxy)-1,4-phenylenevinylene) have been published (for example, as described in Nature, 347, p. 539, (1990) (Non-Patent Document 1) and Appl. Phys. Lett. 58, p. 1982, (1991) (Non-Patent Document 2)).

Thus, simple element deposition techniques with wet deposition (coating deposition) have been developed actively with the use of high-molecular luminescent materials. The solution containing an organic EL material for the wet deposition needs to dissolve the desired organic EL material and to have a desired viscosity. For example, in the case of deposition through a spin coating or ink-jet method, the viscosity of the solution needs to be several cps or more. As techniques for modifying the viscosity, techniques for ink compositions with an alcohol solvent added are disclosed (for example, as described in Japanese Patent Laid-Open Publication No. 2008-124157 (Patent Document 1) and Japanese Patent Laid-open Publication No. 2007-527624 (Patent Document 2)).

PRIOR ART DOCUMENTS

Patent Documents

Patent Document 1: Japanese Patent Laid-Open Publication No. 2008-124157
Patent Document 2: Japanese Patent Laid-open Publication No. 2007-527624
Patent Document 3: Japanese Patent Laid-Open Publication No. 2005-50553
Patent Document 4: Japanese Patent Laid-Open Publication No. 2003-163087

Non-Patent Documents

Non-Patent Document 1: Nature, 347, p. 539, (1990)
Non-Patent Document 2: Appl. Phys. Lett. 58, p. 1982, (1991)

SUMMARY OF THE INVENTION

However, the alcohol solvent added for increasing the solution viscosity is a poor solvent for high-molecular organic EL materials, and thus has the problem of damaging solubility. In addition, even if the composition is adjusted between a good solvent for high-molecular organic EL materials and the alcohol solvent to make it possible to dissolve the materials, a solid constituent will be precipitated with time because of the use of the alcohol functioning as a poor solvent, thus causing to a problem of a short pot life. In addition, the alcohol solvent is known to form an addition complex through a side reaction with a complex in an excited state, and this addition complex causes a change in spectrum shape and a decrease in mobility, thereby causing to degradation of element characteristics.

In addition, while a separate coating technique through an ink-jet (IJ) method is disclosed in order to achieve full-color organic EL displays, the ink-jet technique is expensive, and poor in stability. Therefore, it has been desired to carry out deposition by coating with the use of further inexpensive relief printing or die coating. Furthermore, these coating methods other than the ink-jet method have been requiring organic EL ink compositions which have a further higher viscosity.

An object of the present invention is to solve the problems mentioned above, and thereby provide an organic EL material ink composition which can be applied widely to various coating methods while maintaining high-efficiency and long-life luminescent characteristics. In particular, an object of the present invention is to provide a high-viscosity organic EL ink composition which allows the production through an inexpensive printing technique other than an ink-jet method. Additionally, another object of the present invention is to provide an organic EL element created with the use of the ink described above, which is inexpensive and has high-efficiency and long-life luminescent characteristics.

The present invention provides an ink composition for an organic EL thin film, including: an organic EL material; a liquid crystalline compound with a bandgap of 3.5 eV or more; and a solvent having an organic compound.

The ink composition for an organic EL thin film according to the present invention contains the liquid crystalline compound. The liquid crystal molecules constituting the liquid crystalline compound have a mesogenic moiety with a rigid structure, and thus can improve the viscosity of the ink composition. In addition, the liquid crystal molecules have a spacer moiety, and thus can achieve high compatibility with the organic EL material and other solvents. Thus, an organic EL ink composition can be achieved which is able to be applied to coating methods other than an ink-jet method, and has stability and a high viscosity.

Furthermore, the liquid crystalline compound has a bandgap of 3.5 eV or more, and thus has no influence on the luminous efficiency of a luminescent material with a bandgap of 3.0 eV or less. Accordingly, the luminous efficiency can be maintained in spite of the addition of the liquid crystalline compound.

Furthermore, the liquid crystalline compound preferably contains no functional group of —CN, —OH, or —F. This ink composition for the formation of an organic EL thin film contains no —OH group which forms an addition complex through a side reaction with a complex in an excited state, and thus can maintain lifetime characteristics in spite of the addition of the liquid crystals. In addition, the ink composition contains no —CN group or —F group which is unstable to an electric field, and thus can maintain lifetime characteristics in spite of the addition of the liquid crystalline compound.

Moreover, the liquid crystalline compound preferably has a molecular dipole moment of 4.0 debyes or less.

Furthermore, the liquid crystalline compound is preferably a cholesteric liquid crystal.

An organic EL element according to the present invention includes a light-emitting layer which is formed by the use of the ink composition for the formation of an organic EL thin film. The light-emitting layer includes an organic EL material and a liquid crystalline compound.

An organic EL element according to the present invention includes: a pair of positive electrode and negative electrode; and a light-emitting layer sandwiched between the positive electrode and the negative electrode, which includes an organic EL material and a liquid crystalline compound having a bandgap of 3.5 eV or more.

The liquid crystalline compound preferably contains no functional group of —CN, —OH, or —F. The liquid crystalline compound preferably has a molecular dipole moment of 4.0 debyes or less. The liquid crystalline compound is preferably a cholesteric liquid crystal.

As described above, the ink composition for an organic EL thin film according to the present invention achieves a high viscosity because of the liquid crystalline compound used as an additive, thereby making it possible to provide an ink composition for an organic EL thin film, which can be applied widely to coating methods while maintaining high-efficiency and long-life luminescent characteristics. In particular, a high-viscosity ink composition for an organic EL thin film can be, provided which allows for the production through an inexpensive printing technique other than an ink-jet method because of the achievement of the high viscosity. Additionally, an organic EL element created with the use of the ink described above can be provided which is inexpensive and has high-efficiency and long-life luminescent characteristics.

BRIEF EXPLANATION OF DRAWINGS

The present invention will become readily understood from the following description of preferred embodiments thereof made with reference to the accompanying drawings, in which like parts are designated by like reference numeral and in which.

DETAILED DESCRIPTION OF THE PREFERRED EMBODIMENTS

An ink composition for an organic EL thin film according to an embodiment of the present invention will be described.

First Embodiment

An ink composition for an organic EL thin film (a solution containing an organic EL material) according to the first embodiment of the present invention includes an organic EL material, a liquid crystalline compound, and a solvent. This organic EL ink composition includes the liquid crystalline compound, thus achieving a high viscosity.

The respective constituents will be described below, which are included in the ink composition for an organic EL thin film.

<Luminescent Material>

The solution containing an organic EL material includes a fluorescent or phosphorescent low-molecular luminescent material or high-molecular luminescent material.

Examples of the low-molecular luminescent material include aromatic dimethylidene compounds such as 4,4'-bis (2,2'-diphenyvinyl)-biphenyl (DPVBi), oxadiazole compounds such as 5-methyl-2-[4-[4-(5-methyl-2-benzoxazolyl) phenyl]vinyl]benzoxazole, triazole derivatives such as 3-(4-biphenylyl)-4-phenyl-5-t-butylphenyl-1,2,4-triazole (TAZ), styrylbenzene compounds such as 1,4-bis(2-methylstyryl) benzene, fluorescent organic materials such as a thiopyrazine dioxide derivative, a benzoquinone derivative, a naphthoquinone derivative, an anthraquinone derivative, a diphenoquinone derivative, and a fluorenone derivative, and fluorescent organometallic compounds such as an azomethine zinc complex and a (8-hydroxyquinolinato)aluminum complex (Alq3).

Examples of the high-molecular luminescent material include polyphenylenevinylene derivatives such as poly(2-decyloxy-1,4-phenylene) (DO-PPP), poly[2,5-bis-[2-(N,N, N-triethylammonium)ethoxy]-1,4-phenyl-alt-1,4-phenylene]dibromide (PPP-NEt3+), poly[2-(2'-ethylhexyloxy)-5-methoxy-1,4-phenylenevinylene] (MEH-PPV), poly[5-methoxy-(2-propanoxysulfonide)-1,4-phenylenevinylene]

Figure 1:
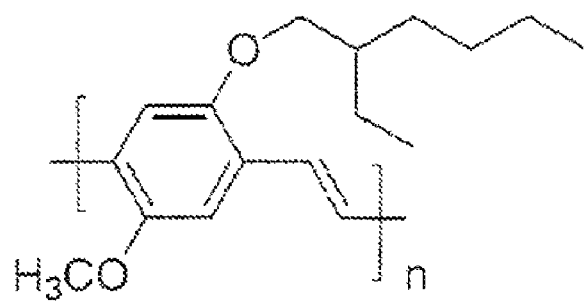
FIG. 1 is a structural formula of polyphenylenevinylene (PPV) as an example of high-molecular luminescent materials.
Figure 2:
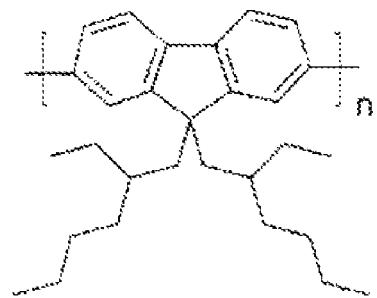
FIG. 2 is a structural formula of polyfluorene (PFO) as an example of high-molecular luminescent materials.

(MPS-PPV), and poly[2,5-bis-(hexyloxy)-1,4-phenylene-(1-cyanovinylene)] (CN-PPV), and polyspiro derivatives such as poly(9,9-dioctylfluorene) (PDAF), poly(9,9-dioctylfluorenyl-2,7-diyl)-co-(1,4-vinylenephenylene) (PDFBP), and poly(9,9-dioctylfluorenyl-2,7-diyl)-co-(N,N'-diphenyl)-N, N'-di(p-butylphenyl)-1,4-diaminobenzene) (PDFDBFDAB). Preferable high-molecular luminescent materials are, for example, poly(2-methoxy-5-(2-ethylhexyloxy)-1,4-phenylenevinylene) (abbreviation: PPV-MEH, FIG. 1) and poly(9,9-bis-(2-ethylhexyl)-9H-fluorene 2,7-diyl (abbreviation: PEHF, FIG. 2).

<Other Materials Added To Solution Containing Organic EL Material>

In addition, in order to improve the luminous efficiency of the luminescent material, a carrier transporting material, and a material to serve as a guest compound or a host compound for the luminescent material may be added to the solution containing an organic EL material.

As the carrier transporting material, for example, a low-molecular carrier transporting material is preferable which is able to be deposited by coating without the need for any binder. In addition, the low-molecular carrier transporting material is more preferably highly amorphous and heat-resistant, and easily synthesized and purified. Further, the carrier transporting material may have a hole transporting property.

Examples of the guest compound for the luminescent material or the host compound for the light-emitting layer include low-molecular materials such as coumarin derivatives, anthracene derivatives, naphthacene derivatives, and pentacene derivatives.

<Liquid Crystalline Compound>

Figure 3:
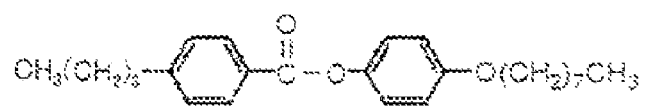
FIG. 3 is a structural formula of 4-N-octyloxyphenyl 4-butylbenzoate (BBOP) as an example of liquid crystalline compounds.
Figure 4:
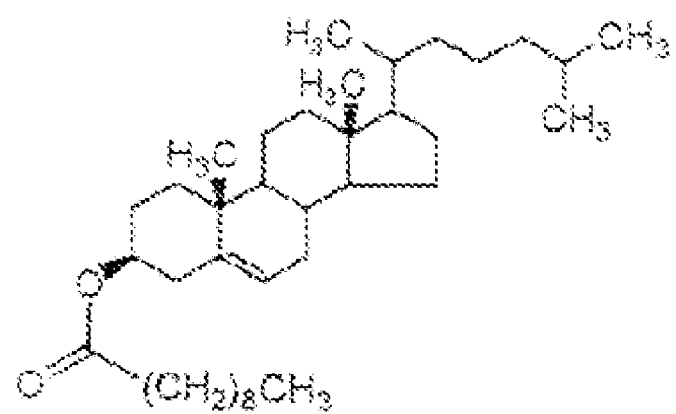
FIG. 4 is a structural formula of cholesterol N-caprate (CC) as an example of liquid crystalline compounds.

The ink composition for an organic EL thin film (the solution containing an organic EL material) according to the present invention is characterized by further having the liquid crystalline compound. As the liquid crystalline compound, one liquid crystalline compound is, or two or more liquid crystalline compounds are selected from nematic liquid crystals, cholesteric liquid crystals, discotic liquid crystals, smectic liquid crystals, etc. In addition, a single compound or a mixture may be used for the liquid crystalline compound. Furthermore, low-molecular liquid crystalline compounds or high-molecular liquid crystalline compounds may be used as the liquid crystalline compound. Preferable liquid crystalline compounds include, for example, cholesterol N-caprate (abbreviation: CC, FIG. 3) and 4-N-octyloxyphenyl 4-butylbenzoate (abbreviation: BBOP, FIG. 4).

The liquid crystal molecules constituting the liquid crystalline compound have a mesogenic moiety with a rigid structure and a spacer moiety. Because of the presence of the mesogenic moiety with a rigid structure, the viscosity of the ink composition can be improved. In addition, because of the presence of the spacer moiety, high compatibility can be achieved with the organic EL material and other solvents. Thus, an ink composition for an organic EL thin film can be achieved which is also able to be applied to coating methods other than an ink-jet method, and has stability and a high viscosity.

The liquid crystalline compound is further desirably a liquid crystalline compound containing no —CN group, —OH group, or —F group. The use of these liquid crystalline compounds can maintain, in spite of cases of the liquid crystalline compounds added, comparable lifetime characteristics to cases of no liquid crystalline compound added, because the liquid crystalline compounds contain no —OH group which forms an addition complex through a side reaction with a complex in an excited state. In addition, the ink composition contains no —CN group or —F group which is unstable to an electric field, and thus can maintain comparable lifetime characteristics to cases of no liquid crystalline compound added, in spite of the addition of the liquid crystalline compound.

The liquid crystalline compound is further desirably a liquid crystalline compound with a bandgap of 3.5 eV or more. The use of these liquid crystalline compounds has no influence on the luminous efficiency of a luminescent material with a bandgap of 3.0 eV or less, because the liquid crystalline compound has a bandgap of 3.5 eV or more. Therefore, the luminous efficiency can be maintained in spite of the addition of the liquid crystals. The bandgap used herein refers to the difference between the ionization potential and electron affinity of the liquid crystalline compound. The ionization potential and the electron affinity are determined on the basis of vacuum level. The ionization potential is defined as energy required for releasing an electron on the HOMO (highest occupied molecular orbital) level of the liquid crystalline compound to vacuum level, whereas the electron affinity is defined as energy for dropping an electron on the vacuum level to the LUMO (lowest unoccupied molecular orbital) level of the material for stabilization.

The liquid crystalline compound is further desirably a cholesteric liquid crystal. The use of the liquid crystalline compound including a cholesteric liquid crystal can increase the viscosity more efficiently, as shown in experimental examples described later.

In addition, the liquid crystalline compound preferably has a molecular dipole moment of 4.0 debyes or less. It is to be noted that cholesterol N-caprate (abbreviation: CC) has a dipole moment of 2.2504 debyes, whereas 4-N-octyloxyphenyl 4-butylbenzoate (abbreviation: BBOP) has a dipole moment of 3.9104 debyes.

Furthermore, the concentration range of the liquid crystalline compound is preferably a range of 0.5 to 40% by weight, more preferably a range of 1 to 30% by weight in terms of providing a thickening effect and avoiding the influence of an increased resistance, in the entire solution containing the organic EL material. It is to be noted that the additive concentration is further selected from the range mentioned above, depending on the type of the liquid crystalline compound added, the type of the solvent, and the type of the solute.

<Solvent>

In addition, the solvent is selected from aromatic solvents, hydrocarbon solvents, halogen solvents, ester solvents, and ether solvents. The solvent is preferably an aromatic solvent.

Examples of the aromatic solvents include benzene, toluene, xylene, mesitylene, ethylbenzene, linear or branched propylbenzene, butylbenzene, pentylbenzene, hexylbenzene, nonylbenzene, decylbenzene, undecylbenzene, dodecylbenzene, tetralin, and cyclohexylbenzene.

Examples of halogenated hydrocarbon solvents as the halogen solvents include dichloromethane, dichloroethane, chloroform, carbon tetrachloride, tetrachloroethane, trichloroethane, chlorobenzene, dichlorobenzene, and chlorotoluene.

Examples of the ether solvents include dibutylether, tetrahydrofuran, dioxane, anisole, and 3-phenoxytoluene.

The hydrocarbon solvent is selected from linear and branched saturated and unsaturated hydrocarbon solvents having 6 or more carbon atoms, such as hexane, heptane, octane, nonane, decane, and undecane.

The ester solvent may be ethyl acetate, butyl acetate, amyl acetate, or octyl acetate.

With the use of the ink composition for an organic EL thin film with the liquid crystalline compound added as described above, an inexpensive organic EL element can be achieved through the production by coating such as relief printing or die coating.

tion results are the solubility (○: no insoluble matter recognized visually, ×: insoluble matter recognized visually) and the viscosity (cps).

It is to be noted that the viscosity (cps) was measured at a shear rate of $500\ s^{-1}$ and a temperature of 20° C. as measurement conditions with the use of a rheometer (manufactured by TA Instruments: AR-G2).

TABLE 1

| Experimental Example | Luminescent Material | Luminescent Material Concentration (% by weight) | Solvent Composition Ratio CHB/MT | Liquid Crystal Additive | Liquid Crystal Additive Concentration (% by weight) | Solubility | Viscosity cps |
|---|---|---|---|---|---|---|---|
| 1 | PEHF | 1 | 50/50 | — | — | ○ | 2.22 |
| 2 | PEHF | 1 | 50/50 | BBOP | 1 | ○ | 2.27 |
| 3 | PEHF | 1 | 50/50 | BBOP | 5 | ○ | 2.41 |
| 4 | PEHF | 1 | 50/50 | CC | 1 | ○ | 2.27 |
| 5 | PEHF | 1 | 50/50 | CC | 5 | ○ | 2.53 |
| 6 | PPV-MEH | 0.5 | 50/50 | — | — | ○ | 20.3 |
| 7 | PPV-MEH | 0.5 | 50/50 | CC | 1 | ○ | 21.3 |

The ink composition for an organic EL thin film according to the present invention will be described below with reference to experimental examples, while the present invention is not to be considered limited to the following experimental examples. It is to be noted that the following experimental examples include not only examples but also those corresponding to reference examples containing no liquid crystalline compound.

EXPERIMENTAL EXAMPLES

Experimental examples 1 to 7 will be described in which inks were actually prepared as the solution containing an organic EL material.

Experimental Examples 1 to 7

In experimental examples 1 to 7, poly(2-methoxy-5-(2-ethylhexyloxy)-1,4-phenylenevinylene): (abbreviation: PPV-MEH, from Aldrich, FIG. 1) and poly(9,9-bis-(2-ethylhexyl)-9H-fluorene-2,7-diyl, FIG. 2): (abbreviation: PEHF, from Aldrich) were used as luminescent materials. It is to be noted that the PPV-MEH and PEHF are preferred compounds as the luminescent material according to the present invention. Aromatic solvents such as cyclohexylbenzene (CHB) and 4-methoxytoluene (MT) were used as the solvent. Cholesterol N-caprate (CC, Tokyo Chemical Industry Co., Ltd., FIG. 3) and 4-N-octyloxyphenyl 4-butylbenzoate (BBOP, Tokyo Chemical Industry Co., Ltd., FIG. 4) were used as the liquid crystalline compound (the liquid crystal additive in Table 1).

Preparation of the inks (experimental examples 1 to 7) was carried out as follows.

More specifically, the luminescent material was put in a sample bottle, with the addition of the solvent and the liquid crystal additive as a viscosity modifier, thereby preparing the ink. In this case, the types and concentrations for each material were varied as the preparation conditions for the inks to obtain the inks according to experimental examples 1 to 7. The following Table 1 summarizes the preparation conditions and evaluation results for each ink. The preparation conditions for the inks are the respective types and solid content concentrations (% by weight) of the luminescent material, the solvent, and the liquid crystal additive, whereas the evalua- In the experimental examples 2 and 3, the smectic liquid crystal compound BBOP was added to prepare the inks for the formation of organic EL thin films, thereby resulting in favorable solubility and also increased viscosity. In addition, in the experimental examples 4 and 5, the cholesteric liquid crystalline compound CC was added to prepare the inks for the formation of organic EL thin films, thereby resulting in favorable solubility and also increased viscosity. Likewise, in experimental example 7, the cholesteric liquid crystalline compound CC was also added to prepare the ink for the formation of an organic EL thin film, thereby resulting in favorable solubility and also increased viscosity. Thus, it has turned out that the liquid crystal additive is useful for the increase in viscosity.

In addition, as can been seen from the comparison between experimental example 3 and experimental example 5, the use of cholesterol N-caprate (CC) as a cholesteric liquid crystal has a larger viscosity improving effect than the use of 4-N-octyloxyphenyl 4-butylbenzoate (BBOP) as a smectic liquid crystal, even in the case of the same additive concentration of the liquid crystal additive. Therefore, as the liquid crystal additive, the cholesteric liquid crystal is used more preferably than the smectic liquid crystal.

The present invention provides an ink composition for the formation of an organic EL thin film which is excellent in terms of process adequacy, and the ink composition can be used for the production of an inexpensive organic EL element which has high-efficiency and long-life luminescent characteristics.

The invention claimed is:

1. An ink composition for an organic EL thin film, the ink composition comprising:
    an organic EL material;
    a liquid crystalline compound having a bandgap of 3.5 eV or more; and
    a solvent comprising an organic compound,
    wherein the liquid crystalline compound is Cholesterol N-caprate (CC) as a cholesteric liquid crystal.
2. The ink composition for an organic EL thin film according to claim 1, wherein the liquid crystalline compound contains no functional group of —CN, —OH, or —F.
3. The ink composition for an organic EL thin film according to claim 1, wherein the liquid crystalline compound has a molecular dipole moment of 4.0 debyes or less.

4. An organic EL element comprising a light-emitting layer formed by the use of the ink composition for an organic EL thin film according to claim 1, wherein the organic EL element comprises an organic EL material and a liquid crystalline compound.

5. An organic EL element comprising:
a pair of a positive electrode and a negative electrode; and
a light-emitting layer sandwiched between the positive electrode and the negative electrode, wherein the light-emitting layer comprises an organic EL material and a liquid crystalline compound having a bandgap of 3.5 eV or more, and
wherein the liquid crystalline compound is Cholesterol N-caprate (CC) as a cholesteric liquid crystal.

6. The organic EL element according to claim 5, wherein the liquid crystalline compound contains no functional group of —CN, —OH, or —F.

7. The organic EL element according to claim 5, wherein the liquid crystalline compound has a molecular dipole moment of 4.0 debyes or less.

* * * * *